(12) United States Patent
Ye

(10) Patent No.: US 6,312,554 B1
(45) Date of Patent: *Nov. 6, 2001

(54) APPARATUS AND METHOD FOR CONTROLLING THE RATIO OF REACTIVE TO NON-REACTIVE IONS IN A SEMICONDUCTOR WAFER PROCESSING CHAMBER

(75) Inventor: Yan Ye, Campbell, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/761,024

(22) Filed: Dec. 5, 1996

(51) Int. Cl.[7] ................................................. H05H 1/00
(52) U.S. Cl. ........................ 156/345; 118/723 ER; 118/723.1 R; 118/723 E; 118/723 MP; 219/121.51
(58) Field of Search ................... 118/723 E, 723 ER, 118/723.1 R, 723 MP; 156/345 C; 219/121.51

(56) References Cited

U.S. PATENT DOCUMENTS

| 4,664,747 | * | 5/1987 | Sekiguchi et al. | 156/643 |
|---|---|---|---|---|
| 4,859,908 | | 8/1989 | Yoshida et al. | 315/111.81 |
| 4,908,492 | * | 3/1990 | Okamoto et al. | 219/121.52 |
| 5,233,155 | | 8/1993 | Frind | 219/121.52 |
| 5,407,524 | * | 4/1995 | Patrick et al. | 156/627 |
| 5,916,455 | * | 6/1999 | Kumagai | 216/68 |

FOREIGN PATENT DOCUMENTS

| 0388800A2 | 9/1990 | (EP) | H01J/37/32 |
|---|---|---|---|
| 0388800A3 | 9/1990 | (EP) | H01J/37/32 |
| 60018820 | 1/1985 | (JP) | G11B/5/704 |
| 61222534 | 10/1986 | (JP) | B01J/19/08 |

* cited by examiner

Primary Examiner—Frankie L. Stinson
Assistant Examiner—Shamim Ahmed
(74) Attorney, Agent, or Firm—Moser, Patterson & Sheridan

(57) ABSTRACT

A applicator for focusing a plasma directly into a process chamber in which a process gas is injected into an applicator housing through a narrow channel. A focused power source generates a homogeneous plasma from the process gas within the applicator. The homogeneous plasma is focused directly into the process chamber through an outlet defined in the applicator. The outlet is configured to provide a desired expansion of gas or plasma torch strength. In the preferred embodiment of the invention, a plasma of non-reactive species is directly focused into the process chamber to increase the density of the non-reactive ions in the chamber, such that the ratio of reactive and non-reactive ions in the process chamber is controlled, and etch process performance is enhanced.

18 Claims, 4 Drawing Sheets

APPARATUS AND METHOD FOR CONTROLLING THE RATIO OF REACTIVE TO NON-REACTIVE IONS IN A SEMICONDUCTOR WAFER PROCESSING CHAMBER

BACKGROUND OF THE INVENTION

1. Technical Field

The invention relates to plasma processing and plasma processing equipment. More particularly, the invention relates to an apparatus for generating a plasma torch that is focused directly into a process chamber, thereby improving the process, for example the etch profile control of a substrate in the chamber.

2. Description of the Prior Art

Plasma processing is an essential tool of the semiconductor manufacturing industry. Such processing uses electromagnetic radiation to dissociate the molecules of a reactive species and thereby produce a plasma that is directed to the surface of a workpiece, such as a semiconductor wafer, in a process environment, e.g. a vacuum chamber.

A plasma may be produced directly above the surface of the wafer within the process environment, or the plasma may be remotely generated in an applicator, and then conducted to the surface of the wafer. FIG. 1 is a schematic diagram showing a plasma processing environment 10 according to the prior art in which the plasma is remotely generated in an applicator. The plasma processing environment includes a process chamber 12 and an applicator 14 for remotely generating a plasma. The typical plasma applicator comprises a tube, open at at least one end, through which a reactive gas is pumped.

The reactive gas is supplied from a source 16 and may comprise such well known process gases as $CF_4$, $O_2$, $N_2$, $Cl_2$, $NF_3$, and methanol. A waveguide 18 is provided to direct a source of electromagnetic energy 20 to the tube to ignite and maintain a plasma therein. The source of electromagnetic energy may be either an RF signal (typically having a frequency of 13.56 MHz) or it may be (and preferably is) a microwave signal (typically having a frequency of 2.45 GHz).

The plasma thus generated is directed out of the open end of the tube, through a transport conduit 22 toward the process chamber 12, in which a gas distribution plate 26 may be used to spread neutrals and ions for even distribution therein. The neutrals and ions are directed towards a workpiece, typically a semiconductor wafer 28. A wafer support 30 is provided that may also be used as a cathode, while the walls of the process chamber may be used as an anode. After the reactive gas is spent, for example after etching the semiconductor wafer, the gas is exhausted from the process chamber through an exhaust port 32.

One problem encountered in prior art applicators of a remote plasma source is that of species recombination. Reactive species, such as excited species or ions, that are not quickly delivered from the applicator and delivery tube to the process chamber can be changed either from ions to neutrals or from an excited state to a ground state. The recombination could be due to a collision between the ions, electrons, or neutrals, or a collision with the wall of the delivery tube.

Once the plasma has been ignited, it must be sustained. However, in a plasma etch chamber according to the prior art, the composition of ions is not controllable because different reactive species have different levels of ionization energy. The ionization rates of different gases in a gas mixture are therefore determined by the minimum ionization energy of the gases. For example, the minimum ionization energy for $Cl_2$ is approximately 11.5 eV, while that for Ar is 15.8 eV. Thus, in a $Cl_2$ and Ar mixture, the density of $Cl^+$ and $Cl_2^+$ ions is much higher than the density of $Ar^+$ ions. Changes in RF power, chamber pressure, or flow ratio do not effectively change the composition of ions.

It would therefore be advantageous to provide an apparatus and method for providing a secondary or activating plasma source to a process chamber that minimizes losses of ions and reactive species due to recombination. It would be a further advantage if an apparatus and process were available that could control the composition of ions in the process chamber, to thereby improve the etch process and control the etch profile of a substrate being process within the process chamber.

SUMMARY OF THE INVENTION

The invention provides an new plasma applicator in the form of a plasma torch for focusing a separately generated plasma directly into a process chamber. Process gas is injected into the plasma torch through a narrow channel formed therein. The narrow channel provides a higher velocity gas flow while minimizing plasma formation in the channel and upstream gas diffusion.

A focused power source generates a high-density plasma spot within the plasma torch. In a preferred embodiment of the invention, the focused power source is an inductively coupled RF coil that partially or completely surrounds the housing.

The high-density plasma is focused directly into the process chamber through an outlet defined in the torch. The shape and dimensions of the outlet are chosen to provide a desired expansion of gas or a hollow electrode effect to focus the RF power to enhance plasma torch strength.

In the preferred embodiment of the invention, a plasma torch will be used as an additional plasma source to adjust the composition of ions in the process chamber, i.e., the plasma torch generates a plasma of non-reactive species. The plasma is then directly focused into the process chamber to increase the density of the non-reactive ions, to thereby improve the etch process and control the etch profile of a substrate being processed within the process chamber. The plasma torch is also used with other plasma sources. The power supplied to the plasma torch and/or the other source could be modulated or pulsed at the same or different frequency for better chemical species composition control.

DETAILED DESCRIPTION OF THE INVENTION

The invention provides an apparatus for focusing a plasma torch directly into a process chamber. The preferred embodiment of the invention provides an apparatus and method that generates a plasma torch having flow rate ranging from approximately 100 SCCM (Standard Cubic Centimeter per Minute) to 1000 SCCM.

Figure 1:
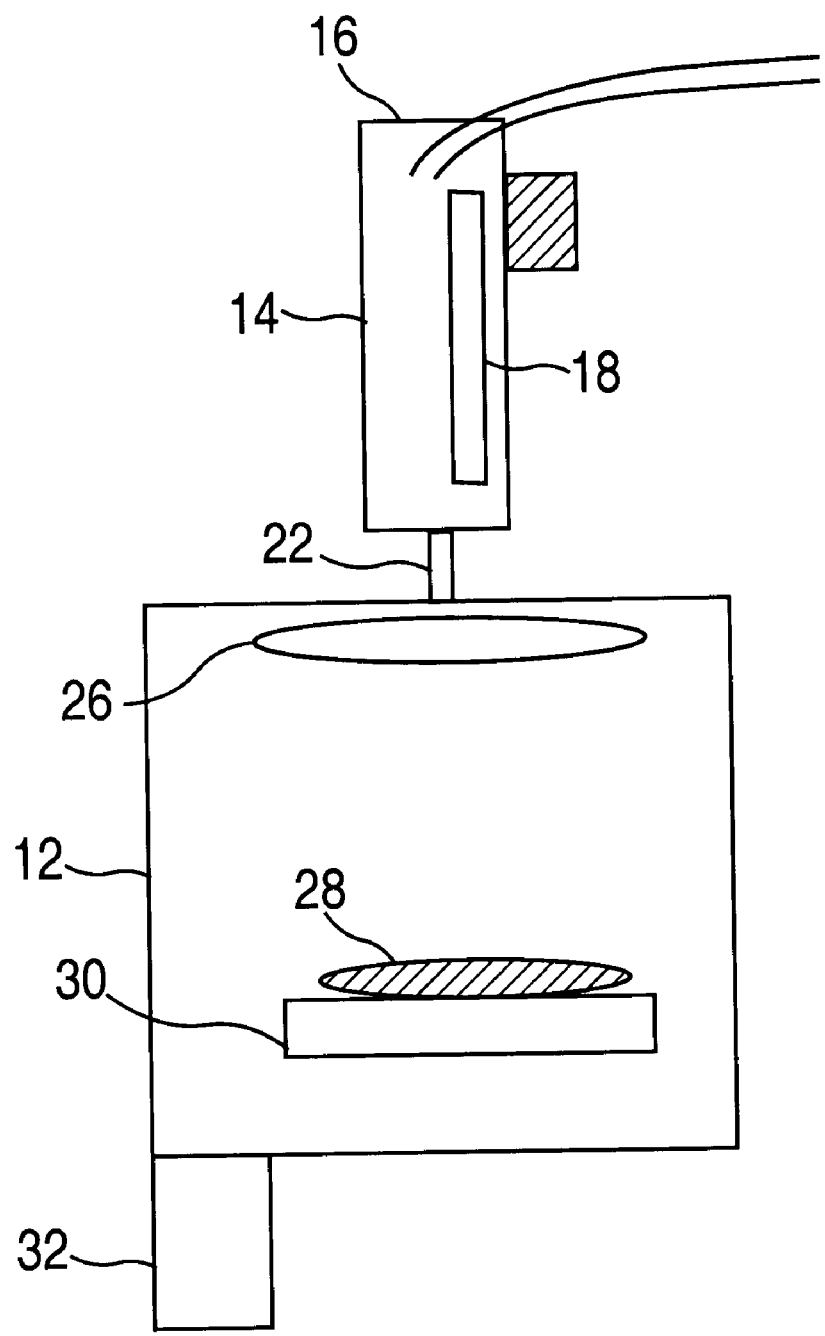
FIG. 1 is a schematic diagram of a plasma applicator according to the prior art.
Figure 2:
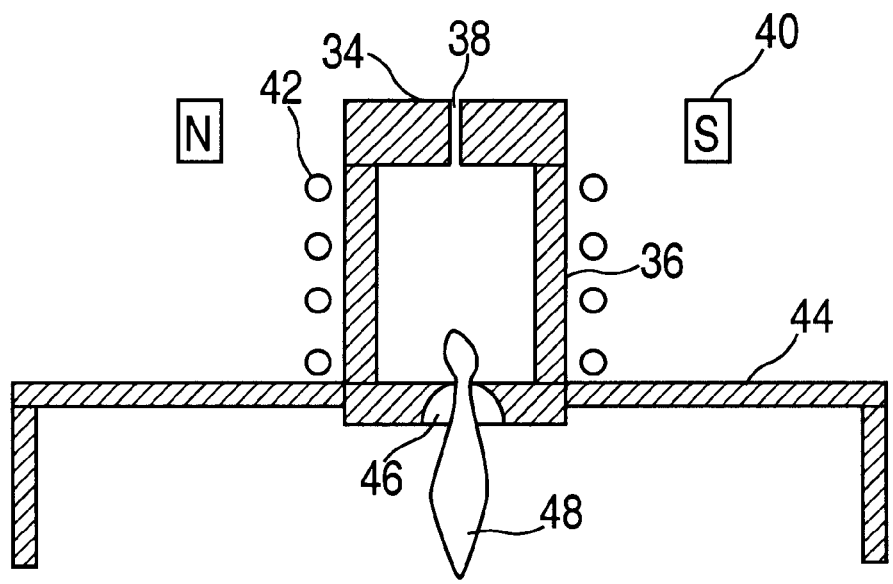
FIG. 2 is a side sectional view of an apparatus for generating a low flow rate plasma torch according to a first preferred embodiment of the invention.

FIG. 2 is a side sectional view of an apparatus 34 for generating a low flow rate plasma torch, according to the invention, in which the an applicator for generating a remote plasma includes a housing 36 that is joined to a process chamber 44. The applicator is preferably located at the top or side of the process chamber. The top 50 and bottom 52 surfaces of the applicator housing may be either flat or hemispherical shaped. The hemispherical shape can help to form a more focused plasma due to hollow electrode effects.

A process gas is injected into the applicator housing 36 through a narrow channel 38 formed therein. The narrow diameter of the channel minimizes the possibility of plasma formation within the channel, as well as the possibility of upstream plasma diffusion. In a preferred embodiment of the invention, a magnet 40 is provided proximate to the channel for generating a magnetic field that enhances the blockage of the plasma to reduce upstream diffusion further.

The velocity of the gas is controlled by the initial gas flow rate and by the dimensions of the channel. For example, a flow rate of between 10 cm$^3$ per minute and 100 cm$^3$ per minute is achieved with a channel diameter of about ⅛ in. to 0.02 in. or less, and a channel length of about ¼ in. or longer. The same flow rate may also be achieved by providing a higher initial flow rate through a wider channel.

Figure 3:
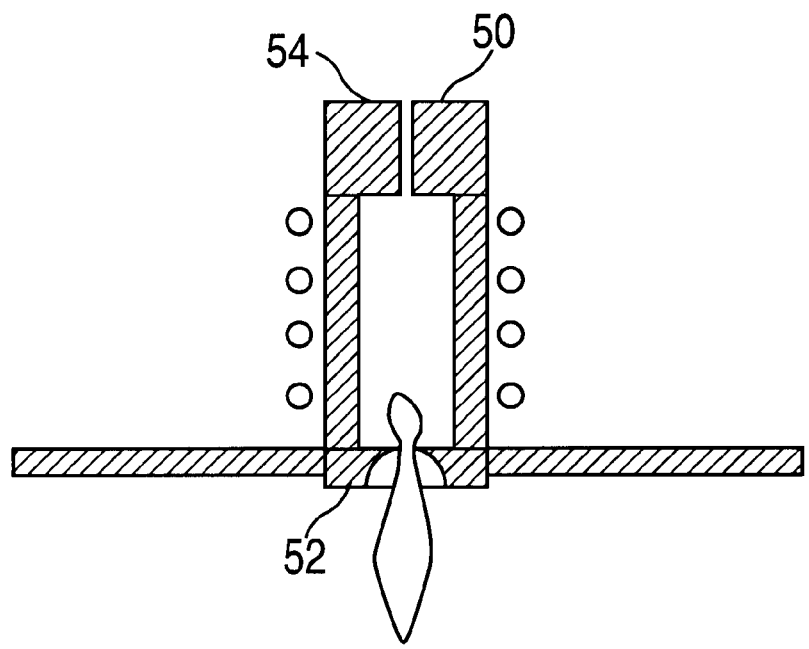
FIG. 3 is a side sectional view of an apparatus for generating a high flow rate plasma torch according to a second, equally preferred embodiment of the invention.

A homogeneous plasma is generated within the applicator. In one preferred embodiment of the invention, the applicator housing has a diameter having a range of from about 1/16 in. to about 1 in. The length to diameter ratio of the housing is from about 1:1 to about 10:1. See, for example FIG. 3, which is a side sectional view of an apparatus 54 for generating a high flow rate plasma torch.

In another, equally preferred embodiment, the housing diameter is from about 1 in. to about 3 in., and the length to diameter ration is from about 1:1 to about 0.1:1.

Figure 4:
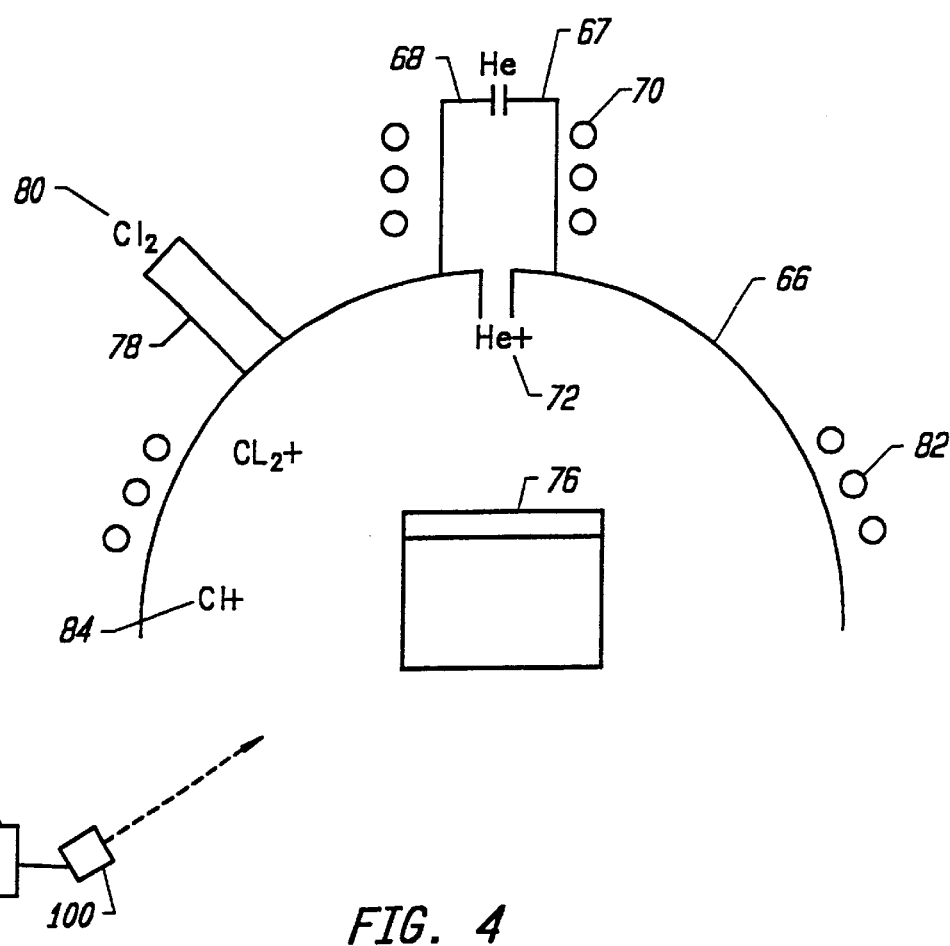
FIG. 4 is a side sectional view of the system for injecting non-reactive ions into a process chamber according to the invention.

A focused power source (discussed in greater detail below) is provided to generate the homogeneous plasma. In the preferred embodiment of the invention, the focused power source is an inductively coupled radio frequency ("RF") coil 42 that partially or completely surrounds the applicator housing. The coil preferably has between 1 to 10 turns, with a coil spacing of about 1 mm or larger. At a fixed power, more turns result in less RF current through the coil, but higher RF voltage, and higher capacitive coupling from coil to plasma. In the preferred embodiment, the frequency of the RF signal that is applied to the gas is about 2 MHz or higher, and preferably about 13.56 MHz or higher. FIG. 4 is a side sectional view of an applicator and process chamber 66, in which the applicator disclosed herein is provided to inject non-reactive ions into the process chamber. A non-reactive gas 67, such as He, is pumped into the applicator housing 68. The gas is typically of a type as is used for the generation of non-reactive ions and may alternately be an inert gas, such as Ar or Xe, or any gases that can form a passivation layer to protect the side wall of etched features, such as gases that are rich in C and/or Si.

A power source, such as that provided by inductive coupling to the reactive gas via the RF coils 70, when the coils are supplied with RF signal at a constant frequency of 13.56 MHz, generates non-reactive He$^+$ ions 72 within the applicator with or without power magnitude modulation or pulse. The applicator produces a plasma torch of these non-reactive ions that is focused into the process chamber 76.

In alternative embodiments of the invention, a separate source 78 may be provided to inject a reactive species 80, such as Cl$^+$, Cl$_2^+$, and Cl$_2$, into the process chamber without power modulation. Inductive RF coils 82 supplied with an RF signal, for example at a constant frequency of 2 MHz with a power magnitude modulation at a frequency of about 10 KHz and 50% duty ratio, surrounding the process chamber generate a plasma of reactive ions 84, such as Cl$^+$ and Cl$_2^+$ ions, and a lot of negative ions Cl$^-$ therein. In alternate embodiments of the invention, the reactive ion plasma may be remotely generated.

The gas flow rate according to this embodiment of the invention is from approximately 15 SCCM to 200 SCCM. The process chamber is typically heated to about 80° C., and is maintained at pressures of about 5 to 30 millitorr. The density of the non-reactive ions in the chamber may be varied by the addition of ions. Because the ion density of pure inert gas is usually higher than that of many reactive gases, total ion density in the chamber plasma can also be increased by non-reactive ion injection. The injection of such non-reactive ions may also provide sufficient energy to enhance the excitation and ionization of reactive gases within the process chamber.

The invention is useful for controlling the ratio of reactive ions to non-reactive ions to thereby improve etch process performance. For example, by increasing the ratio of non-reactive to reactive ions the reaction between photoresist and reactive ions is minimized, improving etch selectivity to photoresist. Supplying additional non-reactive ions also minimizes side-wall roughness caused by reactive ion attack.

The non-reactive ion plasma torch may be focused into the process chamber during a specific time period or step of an etch process. For example, more non-reactive ions may be injected into the process chamber during the main etch step. Fewer or no non-reactive ions may be injected into the process chamber during etch residue removal and profile control steps. The etch profile of a substrate is thus readily adjusted by changing the non-reactive ion density. Reducing the etch rate of photoresist by introducing more non-reactive ions also improves etch micro-loading.

Figure 5:
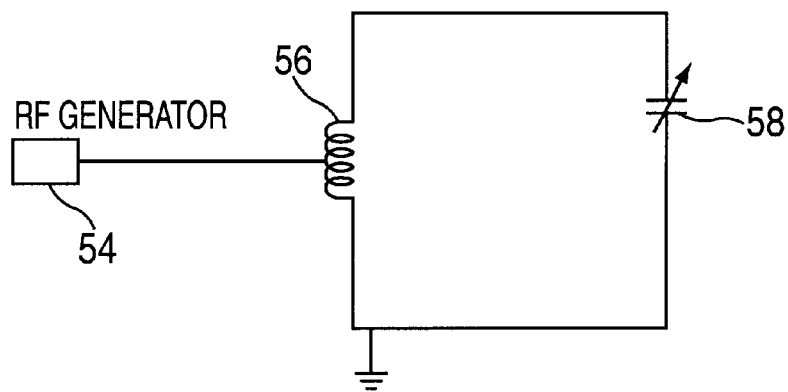
FIG. 5 is a circuit diagram of the apparatus for generating a plasma torch according to the invention.
Figure 6A:
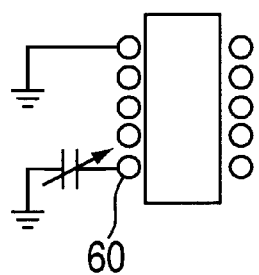
FIGS. 6a–6c are circuit diagrams of coil configurations according to various alternative embodiments of the invention.
Figure 6B:
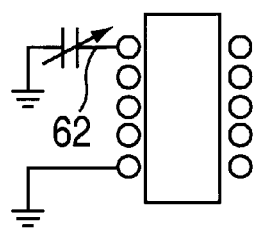
Figure 6C:
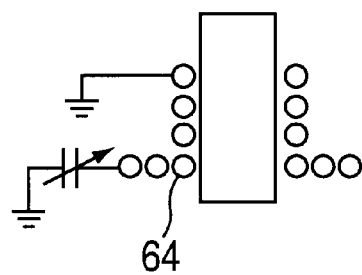

FIG. 5 is a circuit diagram of a preferred apparatus that may be used to practice the invention. An RF generator 54 supplies power to an inductor 56 which is connected in series with a variable capacitor 58. The inductive coil may have various configurations, such as the examples shown in FIGS. 6a–6c. Thus, the coil may be straight and cylindrical in shape (FIGS. 6a and 6b), where the power is applied at the bottom of the coil 60, or at the top of the coil 62, or the coil may be a curved, funnel shaped coil 64 (FIG. 6c). One skilled in the art would readily appreciate that other focused power sources may also be used to generate the homogeneous plasma. For example, capacitively coupled power or microwave power may be applied to the reactive gas inside the process chamber itself.

The homogeneous plasma is focused directly into the process chamber through an outlet 46 formed in the applicator housing. The outlet is preferably hemispherical or cylindrical in shape. Such shapes can provide a desired expansion of gas or a hollow electrode effect to focus the RF power, such that the plasma torch 48 strength is thereby enhanced. The diameter of the outlet preferably ranges from about 0.02 in. to about 1 in. The upper limit of the outlet diameter is determined by the diffusion velocity of the particular gas species, where the gas flow velocity at the outlet is equal to or larger than the diffusion velocity. Contamination of the apparatus by upstream diffusion is thereby minimized. The height of the outlet may range from about 0.02 in. to about 2 in. to provide optimal plasma focus. In one embodiment of the invention, the applicator housing and outlet are combined. A high plasma torch flow rate is thereby achieved. It will be readily apparent to one skilled in the art that the outlet dimensions may be varied to provide other desired plasma torch characteristics.

The plasma torch may be formed such that the focused plasma is injected partially or entirely within the process chamber. Losses of ions and reactive species may thereby be minimized. It is difficult to generate a plasma of certain species in a larger process chamber. However, because the apparatus generates a very high density of ions and radicals within the confines of the applicator housing, the invention facilitates the generation of a plasma comprising such species.

The ions in a plasma reactor may be classified as reactive ions and non-reactive ions. The reactive ions are those that can react with and remove substrate materials. Examples of such reactive ions are the $Cl^+$ and $Cl_2^+$ ions used during a metal etch process. Non-reactive ions are those which do not directly react with substrate material. These non-reactive ions, such as $Ar^+$ and $C^+$ ions may enhance the reaction in the direction of bombardment. The efficiency of the etch process and the etch profile of the substrate is responsive to the density and ratio of species within the process chamber. However, the generation of reactive and non-reactive ions is not well controllable in a prior art plasma etch chamber. The desired density of a particular species, and/or the ratio of different species, cannot be easily obtained by changes in RF power, pressure, or flow ratio.

In one preferred embodiment of the invention, the plasma torch generates a homogeneous plasma of non-reactive species. The plasma is directly focused into the process chamber to increase the density of the non-reactive ions to control etch profile of a substrate in the chamber.

In another embodiment of the invention, an endpoint detector 100 (FIG. 4) is provided to control (with a controller 101) the progression of the etch process. A plasma torch of non-reactive ions is selectively focused into the chamber in response to the progression of the process, as detected by endpoint detector.

Although the invention is described herein with reference to the preferred embodiment, one skilled in the art will readily appreciate that other applications may be substituted for those set forth herein without departing from the spirit and scope of the present invention.

For example, more than one applicator may be coupled to a process chamber, such that multiple plasmas are injected into the process chamber. Each applicator may provide a plasma torch of the same species or different species. Furthermore, these multiple plasma torches may include reactive and non-reactive ions. For example, one applicator may provide a mixed-gas plasma for an etch process, while another applicator may provide a non-reactive plasma torch to control the density of the non-reactive ions. The plasma torch may also be used in connection with other, conventional plasma generating means, such as conventional remote plasma generation, or plasma generation within the process chamber.

The power of the plasma torch may be varied by the geometry and placement of the inductive coil. For example, a lower placement around the applicator housing generates a lower power plasma. The configuration of a gas distribution plate within the chamber also affects the power and placement of the plasma torch. The plate must be positioned to minimize plasma backflow, and can also be positioned to focus and direct the plasma torch.

Accordingly, the invention should only be limited by the Claims included below.

What is claimed is:

1. An apparatus for controlling the ratio of reactive to non-reactive ions in a semiconductor wafer processing chamber, comprising:

an first chamber confining a first plasma of reactive ions; and an second chamber coupled to said first chamber, said second chamber having a second plasma of non-reactive species in said second chamber, at least a part of said second plasma is disposed in said first chamber, wherein said second chamber injects non-reactive ions into said first chamber to increase a density of non-reactive ions with respect to a density of the reactive ions in the first plasma.

2. The apparatus of claim 1 further comprising an inductively coupled RF coil surrounding at least part of said second chamber.

3. The apparatus of claim 2, wherein said coil is modulated with RF power at about 100 Hz to about 100 KHz.

4. The apparatus of claim 1, wherein said RF power is supplied from a capacitively coupled source or a microwave source.

5. The apparatus of claim 4, wherein said RF power is modulated.

6. The apparatus of claim 4, wherein said power source is not modulated.

7. The apparatus of claim 1, wherein said second chamber comprises:

a housing having a length and a diameter, wherein said diameter is about 1/16 inch to about 1 inches, and a length-to-diameter ratio is about 1:1 to about 10:1.

8. The apparatus of claim 1, wherein said second chamber comprises:

housing having a length and a diameter, wherein said diameter is about 1 inch to about 3 inches, and a length-to-diameter ratio is about 0.1:1 to about 1:1.

9. The apparatus of claim 1, wherein said second chamber has top and bottom surfaces, and wherein said top and bottom surfaces of said second chamber are either flat or hemispherical-shaped.

10. The apparatus of claim 2, wherein said inductive coupled coil completely surrounds said second chamber.

11. The apparatus of claim 2, wherein said inductively coupled coil is driven with a radio frequency of about at least 2 MHz.

12. The apparatus of claim 1, wherein a flow rate of said non-reactive ions is from about 15 SCCM to about 200 SCCM.

13. The apparatus of claim 1, further comprising:

at least a third chamber for injecting at least a part of a third plasma into said first chamber.

14. The apparatus of claim 1, said second chamber further comprising:

an outlet coupling said second chamber to said first chamber, said outlet having a magnet.

15. An etch chamber comprising:

an etch chamber for forming a first plasma of reactive ions confined in said etch chamber;

an applicator coupled to said etch chamber, said applicator for forming a second plasma of non-reactive ions;

an inductively coupled RF coil surrounding at least part of said applicator; and, an outlet defined in said applicator to focus at least a part of said second plasma into said etch chamber wherein said applicator injects non-reactive ions into said etch chamber to increase a density of non-reactive ions with respect to a density of the reactive ions in the first plasma to control an etching process.

16. A process for controlling the ratio of reactive to non-reactive ions in a semiconductor wafer processing chamber, comprising the steps of:

forming a first plasma of reactive ions in a first chamber;

generating a second plasma of a non-reactive ions in a second chamber; and injecting at least a part of said second plasma into said first chamber wherein said injected non-reactive ions increases a density of non-reactive ions with respect to a density of the reactive ions in the first plasma.

17. The process of claim 16, further comprising the steps of:

providing an endpoint detector system for monitoring and controlling process progression in said first chamber; and injecting said second plasma into said first chamber in response to a signal produced by said endpoint detector system.

18. The process of claim 16, further comprising the step of injecting at least a part of a third plasma directly into said processing chamber.

* * * * *

UNITED STATES PATENT AND TRADEMARK OFFICE
CERTIFICATE OF CORRECTION

PATENT NO. : 6,312,554 B1
DATED : November 6, 2001
INVENTOR(S) : Yan Ye

It is certified that error appears in the above-identified patent and that said Letters Patent is hereby corrected as shown below:

<u>Title page,</u>
ABSTRACT,
Line 1, please replace "A" with -- An --.

<u>Column 2,</u>
Line 20, please replace "an" with -- a --.

<u>Column 3,</u>
Line 12, please delete "the".

Signed and Sealed this

Fourth Day of June, 2002

Attest:

JAMES E. ROGAN
Attesting Officer    Director of the United States Patent and Trademark Office